(12) United States Patent
Tsai

(10) Patent No.: US 9,281,696 B2
(45) Date of Patent: Mar. 8, 2016

(54) CURRENT STEERING CIRCUIT AND CURRENT STEERING METHOD FOR CONTROLLING BRANCH CURRENT FLOWING THROUGH BRANCH

(71) Applicant: Fu-Sheng Tsai, Taoyuan County (TW)

(72) Inventor: Fu-Sheng Tsai, Taoyuan County (TW)

(73) Assignee: Fu-Sheng Tsai, Taoyuan Dist., Taoyuan (TW)

( * ) Notice: Subject to any disclaimer, the term of this patent is extended or adjusted under 35 U.S.C. 154(b) by 213 days.

(21) Appl. No.: 14/191,347

(22) Filed: Feb. 26, 2014

(65) Prior Publication Data

US 2014/0239910 A1    Aug. 28, 2014

Related U.S. Application Data

(60) Provisional application No. 61/769,754, filed on Feb. 27, 2013.

(51) Int. Cl.
*H02J 7/00* (2006.01)
*H03K 5/04* (2006.01)

(52) U.S. Cl.
CPC .............. *H02J 7/0014* (2013.01); *H02J 7/007* (2013.01); *H03K 5/04* (2013.01); *Y10T 307/747* (2015.04)

(58) Field of Classification Search
CPC ...................................................... H02J 7/0019

USPC .................................................. 320/116, 134
See application file for complete search history.

(56) References Cited

U.S. PATENT DOCUMENTS

| 8,729,851 | B2 * | 5/2014 | Bobbin | H02J 7/0029 320/107 |
| 2013/0106354 | A1 * | 5/2013 | Suzuki | H02J 7/0016 320/116 |
| 2014/0239911 | A1 * | 8/2014 | Tsai | H02J 7/007 320/134 |

FOREIGN PATENT DOCUMENTS

JP    2007110887 A    4/2007

* cited by examiner

*Primary Examiner* — Drew A Dunn
*Assistant Examiner* — Harry O'Neill-Becerril
(74) *Attorney, Agent, or Firm* — Winston Hsu; Scott Margo

(57) ABSTRACT

A current steering circuit for controlling a branch current flowing through a branch is provided. The branch is coupled to a first main switch. The current steering circuit includes a sensing device, a first auxiliary switch and a control unit. The sensing device is coupled to the branch and arranged for sensing the branch current to generate a sensing result. The first auxiliary switch is coupled in parallel with the first main switch. The control unit is coupled to the sensing device and the first auxiliary switch, wherein while the first main switch is turned on, the control unit generates a first switch control signal to the first auxiliary switch, and adjusts a duty cycle of the first switch control signal according to the sensing result in order to adjust the branch current.

17 Claims, 6 Drawing Sheets

CURRENT STEERING CIRCUIT AND CURRENT STEERING METHOD FOR CONTROLLING BRANCH CURRENT FLOWING THROUGH BRANCH

CROSS REFERENCE TO RELATED APPLICATIONS

This application claims the benefit of U.S. provisional application No. 61/769,754, filed on Feb. 27, 2013, the contents of which are incorporated herein by reference.

BACKGROUND OF THE INVENTION

1. Field of the Invention

The disclosed embodiments of the present invention relate to branch current adjustment, and more particularly, to a current steering circuit for controlling a branch current flowing through a branch which is coupled to a main switch, and a related current steering method.

2. Description of the Prior Art

In order to provide high power, a plurality of battery branches may be connected in parallel to form a high power battery system, wherein each branch includes a plurality of battery cells (or battery modules). For example, ten battery branches (or battery strings), each of which allows a current of 66 A (Ampere) flowing therethrough, are connected in parallel to form a battery system capable of supplying/receiving a total current of 660 A. However, if the total current of 660 A is shared unequally among the ten branches, the battery system can be damaged. For example, if each of nine of the ten branches has a discharging current of 60 A, a current flowing through the remaining battery branch is 120 A, resulting in an overheating battery cell and even a shorter battery life.

Thus, a novel current steering mechanism is needed to solve the above problems.

SUMMARY OF THE INVENTION

It is therefore one objective of the present invention to provide a current steering circuit for controlling a branch current flowing through a branch which is coupled to a main switch, and a related current steering method to solve the above problems.

According to an embodiment of the present invention, an exemplary current steering circuit for controlling a branch current flowing through a branch is disclosed. The branch is coupled to a first main switch. The exemplary current steering circuit comprises a sensing device, a first auxiliary switch and a control unit. The sensing device is coupled to the branch and arranged for sensing the branch current to generate a sensing result. The first auxiliary switch is coupled in parallel with the first main switch. The control unit is coupled to the sensing device and the first auxiliary switch, wherein while the first main switch is turned on, the control unit generates a first switch control signal to the first auxiliary switch, and adjusts a duty cycle of the first switch control signal according to the sensing result in order to adjust the branch current.

According to an embodiment of the present invention, an exemplary current steering method for controlling a branch current flowing through a branch is disclosed. The branch is coupled to a first main switch. The exemplary current steering method comprises the following steps: sensing the branch current to generate a sensing result; coupling a first auxiliary switch in parallel with the first main switch; and while the first main switch is turned on, generating a first switch control signal to the first auxiliary switch, and adjusting a duty cycle of the first switch control signal according to the sensing result in order to adjust the branch current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

In order to balance a plurality of branch currents flowing through a plurality of branch circuits in a circuitry, the proposed current steering mechanism adjusts an equivalent resistance of a branch circuit by adjusting a duty cycle of a switch control signal (e.g. using a pulse-width modulation (PWM) technique), thereby adjusting/regulating a corresponding branch current to achieve the current balance of the circuitry. More specifically, an auxiliary switch may be coupled in parallel with a main switch, which is used to control a switching state of the branch circuit, and a duty cycle of a switch control signal of the auxiliary switch is adjusted according to a branch current flowing through the branch circuit. Hence, an equivalent resistance of the main switch and the auxiliary switch connected in parallel may be adjusted. To facilitate an understanding of the present invention, an exemplary implementation of a battery system employing the proposed current steering mechanism is given in the following for further description. A person skilled in the art should understand that this is not meant to be a limitation of the present invention.

Figure 1:
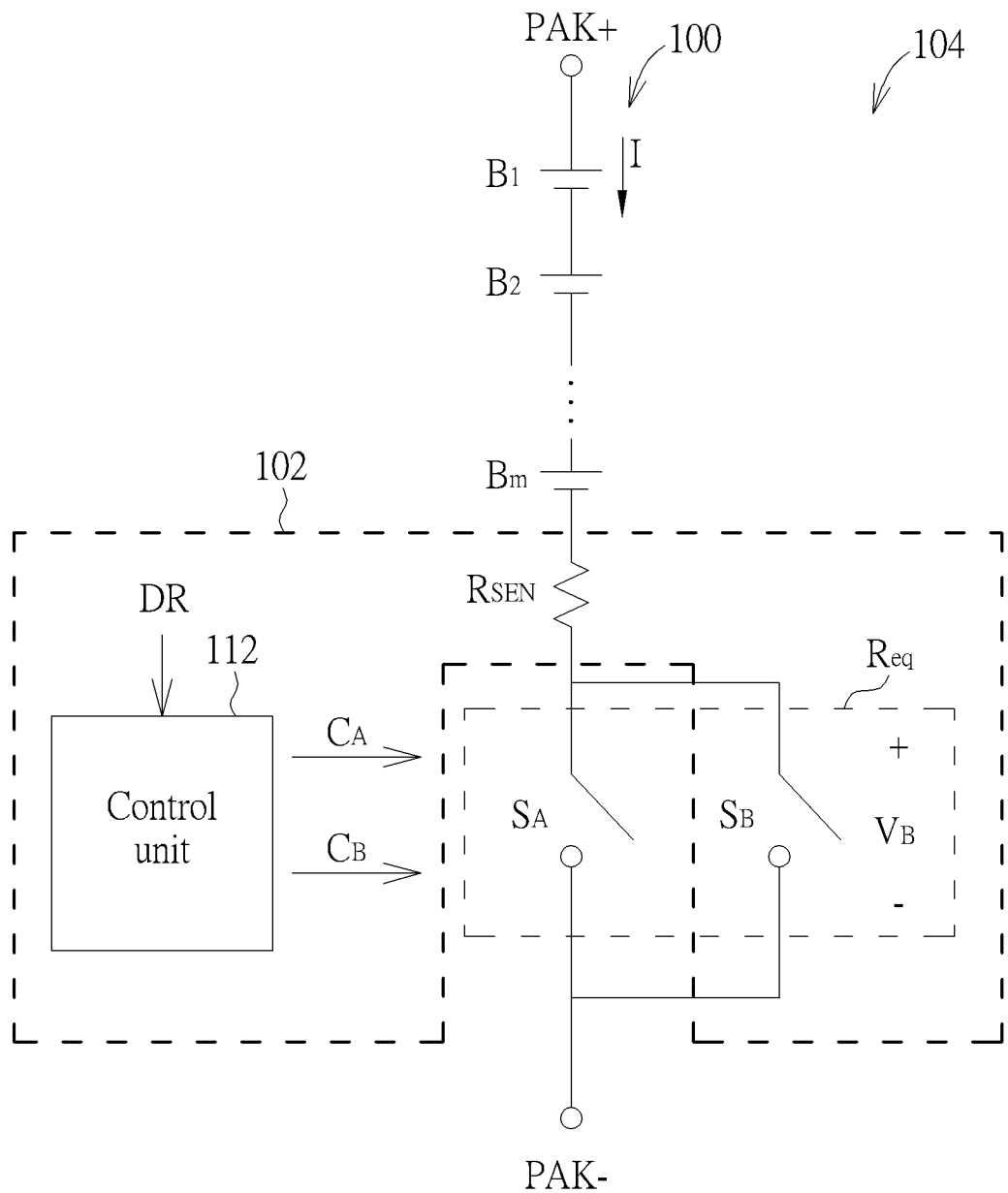
FIG. 1 is a diagram illustrating an exemplary current steering circuit for controlling a branch current flowing through a branch in a battery system according to an embodiment of the present invention.

Please refer to FIG. 1, which is a diagram illustrating an exemplary current steering circuit 102 for controlling a branch current I flowing through a branch 100 in a battery system 104 according to an embodiment of the present invention. In this embodiment, the battery system 104 may include the branch 100, a main switch $S_A$ and the current steering circuit 102. The branch 100 may include, but is not limited to, a plurality of battery units $B_1$-$B_m$ connected in series, wherein each of the battery units $B_1$-$B_m$ may be a battery cell (i.e. a single battery), a battery block (i.e. including parallel-connected batteries), a battery module (i.e. including parallel-connected battery blocks) or a battery pack (i.e. including series-connected batteries and parallel-connected batteries). The battery units $B_1$-$B_m$ may provide required power for an externally coupled electronic apparatus (not shown in FIG. 1) from a node PAK+ (e.g. a high side terminal) and a node PAK− (e.g. a low side terminal), or receive charging power from the node PAK+ and the node PAK−. In an alternative design, the branch 100 may include a single battery unit.

The current steering circuit 102 may include, but is not limited to, a sensing device $R_{SEN}$ (implemented by a resistor in this embodiment), an auxiliary switch $S_B$ and a control unit 112. The sensing device $R_{SEN}$ is coupled between the battery unit $B_m$ and the main switch $S_A$, and is arranged for sensing the branch current I to generate a sensing result DR. The auxiliary switch $S_B$ and the main switch $S_A$ are coupled in parallel between the sensing device $R_{SEN}$ and the node PAK−. Additionally, the control unit 112 is coupled to the sensing device $R_{SEN}$ and the auxiliary switch $S_B$, and is arranged for controlling switching states of the main switch $S_A$ and the auxiliary switch $S_B$. For example, the control unit 112 may generate a switch control signal $C_A$ to control the switching state of the main switch $S_A$, wherein while the main switch $S_A$ is turned on, the control unit 112 may generate a switch control signal $C_B$ to the auxiliary switch $S_B$, and adjust a duty cycle of the switch control signal $C_B$ according to the sensing result DR in order to adjust the branch current I.

Figure 2:
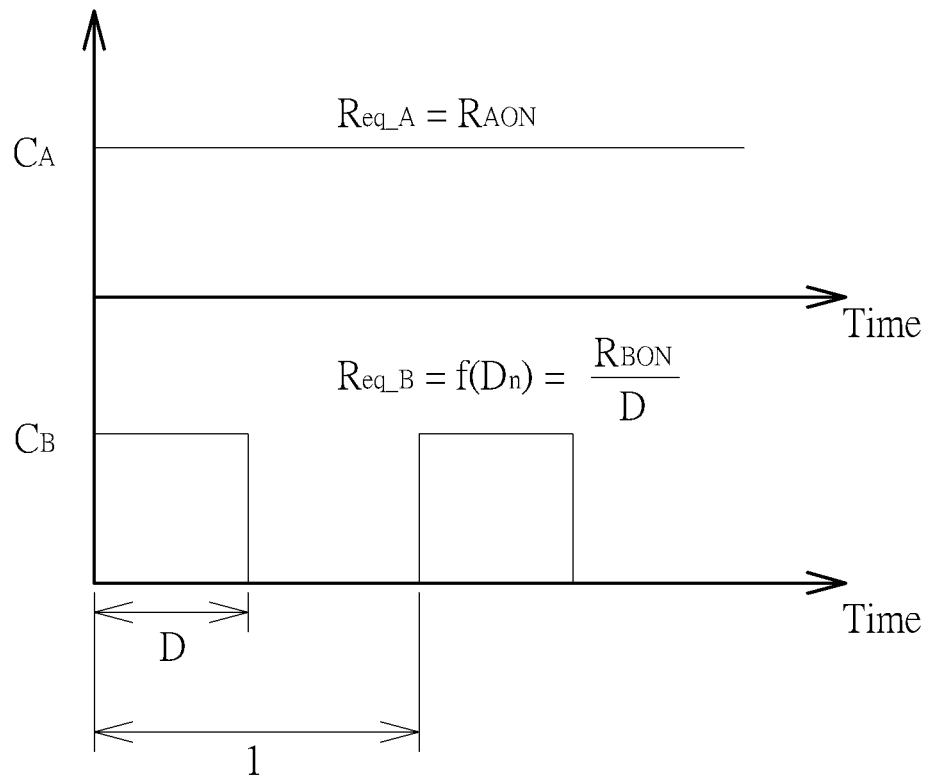
FIG. 2 is an exemplary timing diagram of the switch control signals shown in FIG. 1.

Please refer to FIG. 2 in conjunction with FIG. 1. FIG. 2 is an exemplary timing diagram of the switch control signals $C_A$ and $C_B$ shown in FIG. 1. In this implementation, the switch control signal $C_A$ may stay at a specific level (e.g. a high level) to keep the main switch $S_A$ turned on, and the switch control signal $C_B$ may have a duty cycle D to control the auxiliary switch $S_B$ to switch between a turn-on state and a turn-off state alternately. In one full period of the switch control signal $C_B$, an equivalent resistance $R_{eq\_B}$ of the auxiliary switch $S_B$ may expressed by an equivalent resistance function f (D) shown below.

$$R_{eq\_B}=f(D)=V_B/((V_B/R_{BON})\times D)=R_{BON}/D$$

The voltage $V_B$ is a voltage drop between the auxiliary switch $S_B$ during a turn-on period, the resistance $R_{BON}$ is a turn-on resistance of the auxiliary switch $S_B$, and the expression $(V_B/R_{BON})\times D$ represents an equivalent current during the full period.

As can be seen from the equivalent resistance function f (D), equivalent resistance $R_{eq\_B}$ of the auxiliary switch $S_B$ may vary with the duty cycle D of the switch control signal $C_B$. In addition, as the main switch $S_A$ stays at a turn-on state during the full period of the switch control signal $C_B$ (i.e. a duty cycle of the switch control signal $C_A$ is 100%), an equivalent resistance $R_{eq\_A}$ of the main switch $S_A$ is a turn-on resistance $R_{AON}$ of the main switch $S_A$. An equivalent resistance $R_{eq}$ of a conduction path corresponding to the branch 100 may be expressed as follows:

$$R_{eq}=(R_{AON}\times R_{BON})/(D\times R_{AON}+R_{BON})$$

In view of above, by adjusting the duty cycle D of the switch control signal $C_B$, the equivalent resistance $R_{eq}$ may be adjusted to thereby regulate/adjust the branch current I. In this implementation, the control unit 112 may receive the sensing result DR, and adjust the duty cycle D of the switch control signal $C_B$ according to the sensing result DR. For example, when the sensing result DR indicates that the branch current I is too high (e.g. larger than a predetermined current value), the control unit 112 may decrease the duty cycle D to increase the equivalent resistance $R_{eq}$, thereby reducing the branch current I. In another example, when the sensing result DR indicates that the branch current I is too low (e.g. smaller than a predetermined current value), the control unit 112 may increase the duty cycle D to lower the equivalent resistance $R_{eq}$, thereby increasing the branch current I.

Please note that the above is for illustrative purposes only, and is not meant to be a limitation of the present invention. For example, the sensing device $R_{SEN}$ shown in FIG. 1 may be coupled between the main switch $S_A$ and the node PAK−, and the main switch $S_A$ and the auxiliary switch $S_B$ may be directly coupled to the branch 100 (i.e. coupled between the battery unit $B_m$ and the sensing device $R_{SEN}$). In other words, as long as the sensing device $R_{SEN}$ is electrically coupled to the branch 100 to sense the branch current I, and/or the main switch $S_A$ is electrically coupled to the branch 100 to selectively provide a current conduction path for the branch current I, numerous modifications and variations are possible. Additionally, the branch current I may flow out of the node PAK+ (i.e. the battery system 104 operates in a discharging mode, and the main switch $S_A$ and the auxiliary switch $S_B$ may be used as discharging switches for controlling discharging operations) rather than flow into the node PAK+ (i.e. the battery system 104 operates in a charging mode, and the main switch $S_A$ and the auxiliary switch $S_B$ may be used as charging switches for controlling charging operations). Moreover, the number of the auxiliary switches coupled in parallel with the main switch $S_A$ is not limited to one, and/or a duty cycle of the switch control signal $C_A$ shown in FIG. 2 is not limited to 100%. Such variations and modifications are also intended to fall within the scope of the present invention.

The concept of the present invention may be employed in a circuitry having a branch coupled to a plurality of main switches. Please refer to FIG. 3, which is a diagram illustrating an exemplary current steering circuit 302 for controlling a branch current flowing through a branch in a battery system 304 according to another embodiment of the present invention. In this embodiment, the battery system 304 may include a plurality of branches 300_1-300_n, a plurality of main switches $S_{CA1}$-$S_{CAn}$, a plurality of main switches $S_{DA1}$-$S_{DAn}$, and a current steering circuit 302, wherein each main switch may be implemented by a metal-oxide-semiconductor field-effect transistor (MOSFET), and the current steering circuit 302 may be used to control a plurality of branch currents I1-In which flow through the branches 300_1-300_n respectively. The branches 300_1-300_n may include a plurality of battery units $B_{11}$-$B_{1m}$, $B_{21}$-$B_{2m}$, ..., $B_{n1}$-$B_{nm}$, respectively, wherein the battery units of each branch provide required power for an externally coupled electronic apparatus (not shown in FIG. 3) from a node PAK+ and a node PAK−, or receive charging power from the node PAK+ and the node PAK−.

Figure 3:
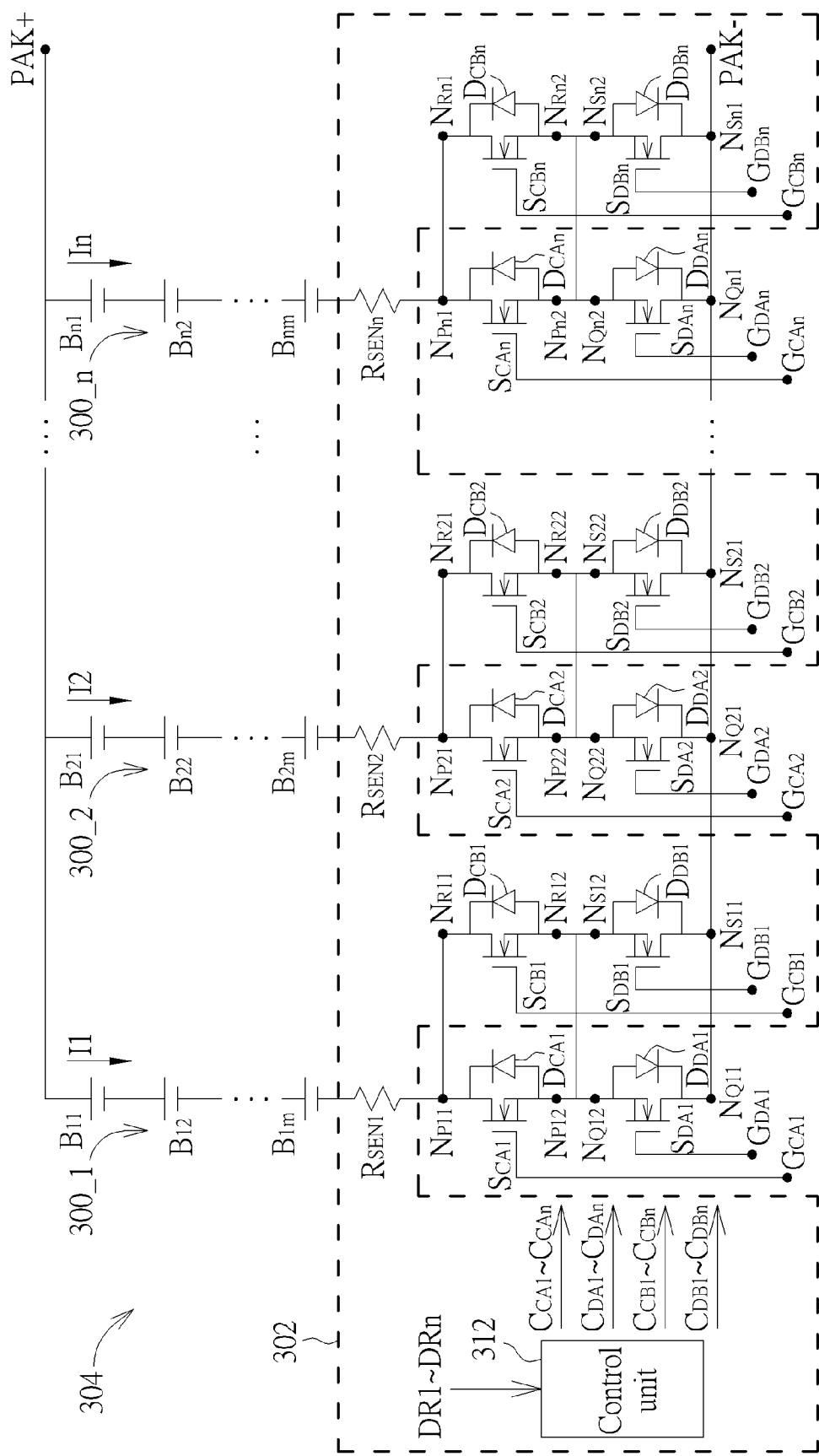
FIG. 3 is a diagram illustrating an exemplary current steering circuit for controlling a branch current flowing through a branch in a battery system according to another embodiment of the present invention.

In FIG. 3, each main switch may have a control terminal, a first connection terminal and a second connection terminal. More specifically, the main switches $S_{CA1}$-$S_{CAn}$ have a plurality of control terminals $G_{CA1}$-$G_{CAn}$, a plurality of first connection terminals $N_{P11}$-$N_{Pn1}$, and a plurality of second connection terminals $N_{P12}$-$N_{Pn2}$; the main switches $S_{DA1}$-$S_{DAn}$ have a plurality of control terminals $G_{DA1}$-$G_{DAn}$, a plurality of first connection terminals $N_{Q11}$-$N_{Qn1}$, and a plurality of second connection terminals $N_{Q12}$-$N_{Qn2}$, wherein the first connection terminals $N_{Q11}$-$N_{Qn1}$ are coupled to the node PAK−, and the second connection terminals $N_{Q12}$-$N_{Qn2}$ are coupled to the second connection terminals $N_{P12}$-$N_{Pn2}$, respectively. Additionally, the main switches $S_{CA1}$-$S_{CAn}$ further have a plurality of body diodes $D_{CA1}$-$D_{CAn}$, and the main switches $S_{DA1}$-$S_{DAn}$ further have a plurality of body diodes $D_{DA1}$-$D_{DAn}$, wherein the body diodes $D_{CA1}$-$D_{CAn}$ and the body diodes $D_{DA1}$-$D_{DAn}$ are coupled in opposite directions, respectively.

The current steering circuit 302 may include, but is not limited to, a plurality of sensing devices $R_{SEN1}$-$R_{SENn}$, a plurality of auxiliary switches $S_{CB1}$-$S_{CBn}$, a plurality of auxiliary switches $S_{DB1}$-$S_{DBn}$, and a control unit 312. The sensing devices $R_{SEN1}$-$R_{SENn}$ are coupled to the battery units $B_{1m}$-$B_{nm}$, respectively (i.e. coupled to the branches 300_1 -300_n, respectively), and coupled to the first connection terminals $N_{P11}$-$N_{Pn1}$. Each auxiliary switch may be implemented by a MOSFET, and have a control terminal, a first connection terminal and a second connection terminal. More specifically, the auxiliary switches $S_{CB1}$-$S_{CBn}$ may have a plurality of control terminals $G_{CB1}$-$G_{CBn}$, a plurality of first connection terminals $N_{R11}$-$N_{Rn1}$, and a plurality of second connection terminals $N_{R12}$-$N_{Rn2}$, wherein the first connection terminals $N_{R11}$-$N_{Rn1}$ are coupled to the first connection terminals $N_{P11}$-$N_{Pn1}$, and the second connection terminals $N_{R12}$-$N_{Rn2}$ are coupled to the second connection terminals $N_{P12}$-$N_{Pn2}$. To put it another way, the auxiliary switches $S_{CB1}$-$S_{CBn}$ are coupled in parallel with the main switches $S_{CA1}$-$S_{CAn}$, respectively. The auxiliary switches $S_{DB1}$-$S_{DBn}$ may have a plurality of control terminals $G_{DB1}$-$G_{DBn}$, a plurality of first connection terminals $N_{S11}$-$N_{Sn1}$, and a plurality of second connection terminals $N_{S12}$-$N_{Sn2}$, wherein the first connection terminals $N_{S11}$-$N_{Sn1}$ are coupled to the first connection terminals $N_{Q11}$-$N_{Qn1}$, and the second connection terminals $N_{S12}$-$N_{Sn2}$ are coupled to the second connection terminals $N_{Q12}$-$N_{Qn2}$. To put it another way, the auxiliary switches $S_{DB1}$-$S_{DBn}$ are coupled in parallel with the main switches $S_{DA1}$-$S_{DAn}$, respectively. In addition, the auxiliary switches $S_{CB1}$-$S_{CBn}$ further have a plurality of body diodes $D_{CB1}$-$D_{CBn}$, and the auxiliary switches $S_{DB1}$-$S_{DBn}$ further have a plurality of body diodes $D_{DB1}$-$D_{DBn}$, wherein the body diodes $D_{CB1}$-$D_{CBn}$ and the body diodes $D_{DB1}$-$D_{DBn}$ are coupled in opposite directions, respectively.

The sensing devices $R_{SEN1}$-$R_{SENn}$ may be used to sense the branch currents I1-In, respectively, and accordingly generate a plurality of sensing results DR1-DRn to the control unit 312. The control unit 312 is coupled to the sensing devices $R_{SEN1}$-$R_{SENn}$, the main switches $S_{CA1}$-$S_{CAn}$, the main switches $S_{DA1}$-$S_{DAn}$, the auxiliary switches $S_{CB1}$-$S_{CBn}$ and the auxiliary switches $S_{DB1}$-$S_{DBn}$. The control unit 312 may generate a plurality of switch control signals $C_{CA1}$-$C_{CAn}$, $C_{DA1}$-$C_{DAn}$, $C_{CB1}$-$C_{CBn}$ and $C_{DB1}$-$C_{DBn}$ in order to control switching states of the main switches $S_{CA1}$-$S_{CAn}$, the main switches $S_{DA1}$-$S_{DAn}$, the auxiliary switches $S_{CB1}$-$S_{CBn}$ and the auxiliary switches $S_{DB1}$-$S_{DBn}$.

Please note that, in the battery system 304 shown in FIG. 3, a sensing device corresponding to each branch may be used to implement the sensing device $R_{SEN}$ shown in FIG. 1, and a main switch and an associated auxiliary switch corresponding to each branch may be used to implement the main switch $S_A$ and the auxiliary switch $S_B$ shown in FIG. 1. More specifically, the main switches $S_{SCA1}$-$S_{CAn}$ may be used as a plurality of charging switches, which are arranged to control charging operations of the battery system 304. Additionally, the main switches $S_{DA1}$-$S_{DAn}$ may be used as a plurality of discharging switches, which are arranged to control discharging operations of the battery system 304. Further description is detailed below.

Figure 4:
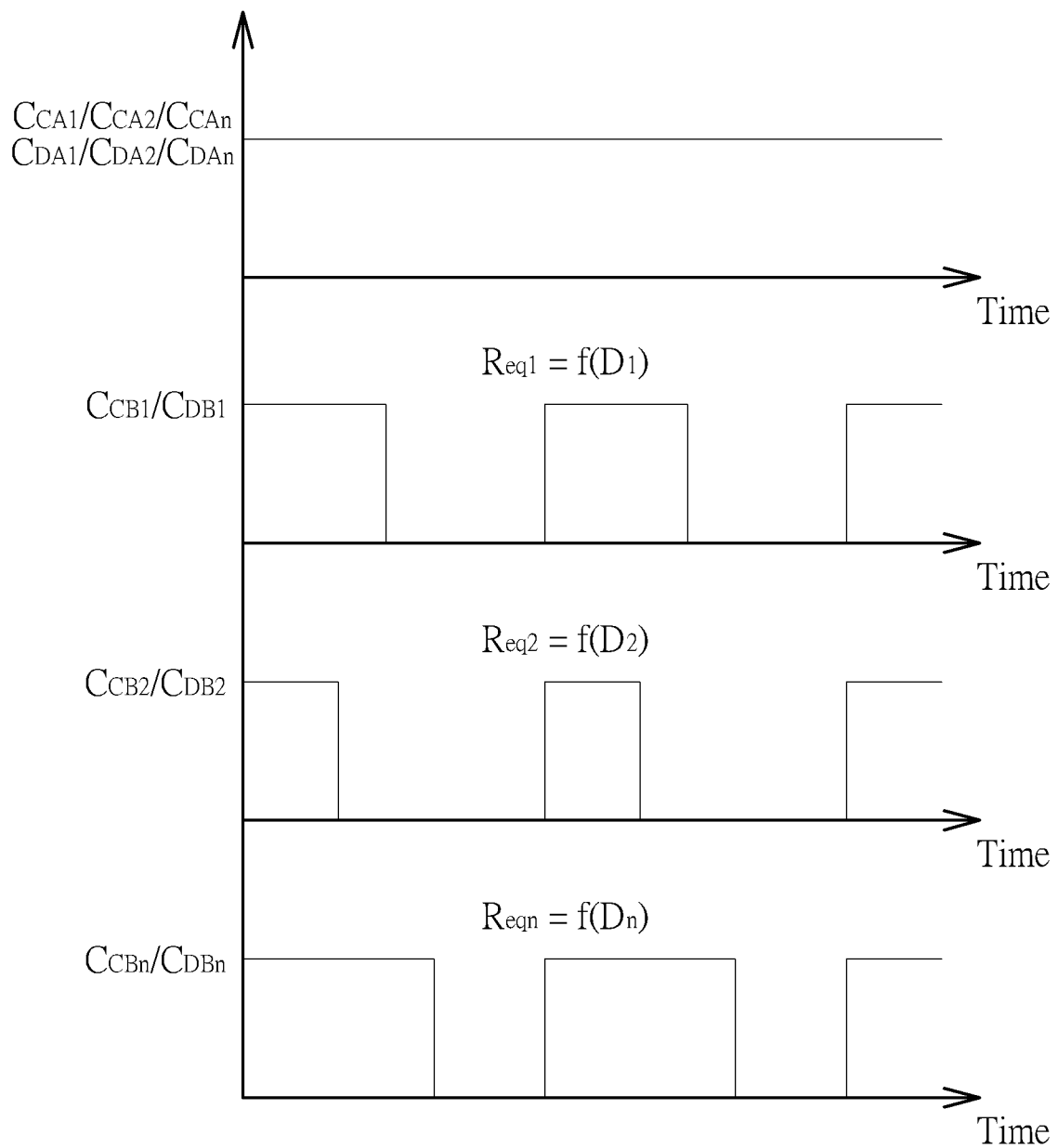
FIG. 4 is an exemplary timing diagram of the switch control signals shown in FIG. 3.
Figure 5:
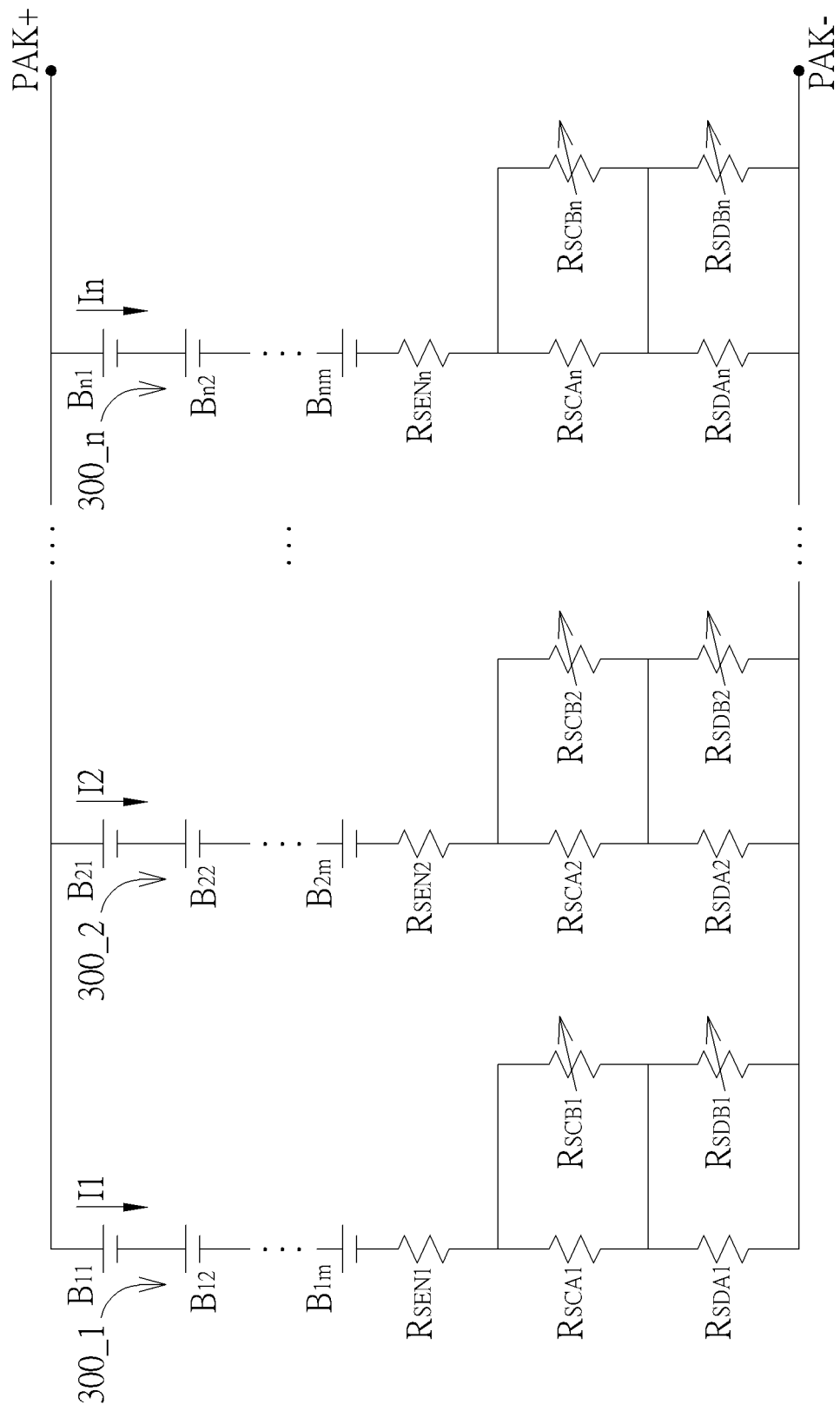
FIG. 5 is a diagram illustrating an equivalent circuitry of the battery system shown in FIG. 3.

Please refer to FIG. 4 and FIG. 5 in conjunction with FIG. 3. FIG. 4 is an exemplary timing diagram of the switch control signals shown in FIG. 3, and FIG. 5 is a diagram illustrating an equivalent circuitry of the battery system 304 shown in FIG. 3. For clarity and simplicity, FIG. 4 illustrates a timing diagram of the switch control signals involved in the branches 300_1, 300_2 and 300_n only, and FIG. 5 illustrates an equivalent circuitry corresponding to the branches 300_1, 300_2 and 300_n. In this implementation, as the battery system 304 may operate in a charging mode, the control 312 may turn on charging switches and discharging switches. More specifically, the switch control signals $C_{CA1}$-$C_{CAn}$ and the switch control signals $C_{DA1}$-$C_{DAn}$ may stay at a specific level (e.g. a high level) to keep the corresponding main switches $S_{CA1}$-$S_{CAn}$ (i.e. charging switches) and the corresponding main switches $S_{DA1}$-$S_{DAn}$ (i.e. discharging switches) turned on (as shown in FIG. 4), wherein the main switches $S_{CA1}$-$S_{CAn}$ may be represented by a plurality turn-on resistances $R_{SCA1}$-$R_{SCAn}$, respectively, and the main switches $S_{DA1}$-$S_{DAn}$ may be represented by a plurality turn-on resistances $R_{SDA1}$-$R_{SDAn}$, respectively (as shown in FIG. 5).

The control unit 312 may generate a plurality of switch control signals $C_{CB1}$-$C_{CBn}$ and a plurality of switch control signals $C_{DB1}$-$C_{DBn}$ to turn on the auxiliary switches $S_{CB1}$-$S_{CBn}$ (i.e. the charging switches) and the auxiliary switches $S_{DB1}$-$S_{DBn}$ (i.e. discharging switches), wherein while a main switch of each branch (e.g. the main switch $S_{CA1}/S_{DA1}$ of the branch 300_1) is turned on, the control unit 312 may adjust a duty cycle of a switch control signal of a corresponding auxiliary switch (e.g. the switch control signal $C_{CB1}/C_{DB1}$ of the auxiliary switch $S_{CB1}/S_{DB1}$) according to a corresponding sensing result (e.g. the sensing result DR1). Hence, the auxiliary switches $S_{CB1}$-$S_{CBn}$ may be represented by a plurality of variable resistances $R_{SCB1}$-$R_{SCBn}$, respectively, and the auxiliary switches $S_{DB1}$-$S_{DBn}$ may be represented by a plurality of variable resistances $R_{SDB1}$-$R_{SDBn}$, respectively (as shown in FIG. 5). For clarity and simplicity, the switch control signals of the auxiliary switches corresponding to the same branch may have an identical duty cycle (as shown in FIG. 4).

In this embodiment, it is assumed that a current difference between the branch current I1 and an average branch current (e.g. dividing a sum of the branch currents I1-In by the number of the branches 300_1 -300_n) is smaller than a predetermined value. Thus, the sensing result DR1 may indicate that the branch current I1 is substantially identical to the average branch current, and the control unit 312 will not adjust a predetermined duty cycle of the switch control signal $C_{CB1}/C_{DB1}$ (i.e. the duty cycle $D_1$ shown in FIG. 4). In addition, it is assumed that the branch current I2 is larger than a first predetermined current value (e.g. the average branch current plus the predetermined value). Thus, the sensing result DR2 may indicate that the branch current I2 is too high, and the control unit 312 may decrease a duty cycle of the switch control signal $C_{CB2}/C_{DB2}$ (i.e. the duty cycle $D_2$ shown in FIG. 4) in order to reduce the branch current I2. It is further assumed that the branch current In is smaller than a second predetermined current value (e.g. the average branch current minus the predetermined value). Thus, the sensing result DRn may indicate that the branch current In is too low, and the control unit 312 may increase a duty cycle of the switch control signal $C_{CBn}/C_{DBn}$ (i.e. the duty cycle $D_n$ shown in FIG. 4) in order to increase the branch current In.

Similarly, an equivalent resistance $R_{eq1}$ of the auxiliary switch $S_{CB1}/S_{DB1}$, an equivalent resistance $R_{eq2}$ of the auxiliary switch $S_{CB2}/S_{DB2}$, an equivalent resistance $R_{eqn}$ of the auxiliary switch $S_{CBn}/S_{DBn}$ may expressed by equivalent resistance functions $f(D_1)$, $f(D_2)$ and $f(D_n)$ shown below.

$$R_{eq1}=f(D_1)=R_{ON}/D_1=R_{SCB1}=R_{SDB1}$$

$$R_{eq2}=f(D_2)=R_{ON}/D_2=R_{SCB2}=R_{SDB2}$$

$$R_{eqn}=f(D_n)=R_{ON}/D_n=R_{SCBn}=R_{SDBn}$$

Please note that, for simplicity and illustrative purposes, the turn-on resistance of each auxiliary switch is assumed as a resistance $R_{ON}$. Hence, the equivalent resistance of the charging path provided by each branch may be obtained. For example, the equivalent resistance corresponding to the branch 300_1 may be expressed as:

$$(R_{SCA1} \times R_{ON})/(D \times R_{SCA1}+R_{ON})+(R_{SDA1} \times R_{ON})/(D \times R_{DCA1}+R_{ON})$$

As can be seen from the above expression, in order to increase the branch current, the duty cycle may be increased due to the decrease of the equivalent resistance; in order to reduce the branch current, the duty cycle may be decreased due to the increase of the equivalent resistance.

The above is for illustrative purposes only, and is not meant to be a limitation of the present invention. For example, it is feasible to adjust a duty cycle of one of the switch control signals $C_{CB1}$ and $C_{DB1}$ in order to adjust the equivalent resistance corresponding to the branch 300_1. In another example, the switch control signals of the auxiliary switches corresponding to each branch may have different duty cycles. In brief, the spirit of the present invention is obeyed as long as the branch current is regulated/adjusted by adjusting the duty cycle of the switch control signal.

After the charging operations of the battery system 304 are completed (or the branch current achieves a specific current value), the control unit 312 may turn off the charging switches of each branch and keep the discharging switches turned on (e.g. ready to discharge). As a person skilled in the art should understand that the operation of the proposed current steering mechanism performed in the discharging mode is similar to that performed in the charging mode, the description of the current steering mechanism performed in the discharging mode is omitted here for brevity.

It should be noted that, while the auxiliary switch is switched, the main switch coupled in parallel with the auxiliary switch is turned on. Thus, the switching of the auxiliary switch may be regarded as a zero-voltage switching (ZVS) and virtually have no switching losses. Additionally, as the adjustment of the duty cycle is continuously controllable, the equivalent circuit of the main switch and the auxiliary switch connected in parallel can be a high-precision variable resistor. Hence, each branch current may be finely regulated, and branch currents of a circuitry may be precisely balanced. Moreover, when it is detected that one of branches in a circuitry is abnormal (e.g. an overcurrent condition), the proposed current steering mechanism may disable/inactivate/replace the branch and keep monitoring/balancing the rest of the branches. In other words, it is unnecessary to inactivate the whole circuitry.

Figure 6:
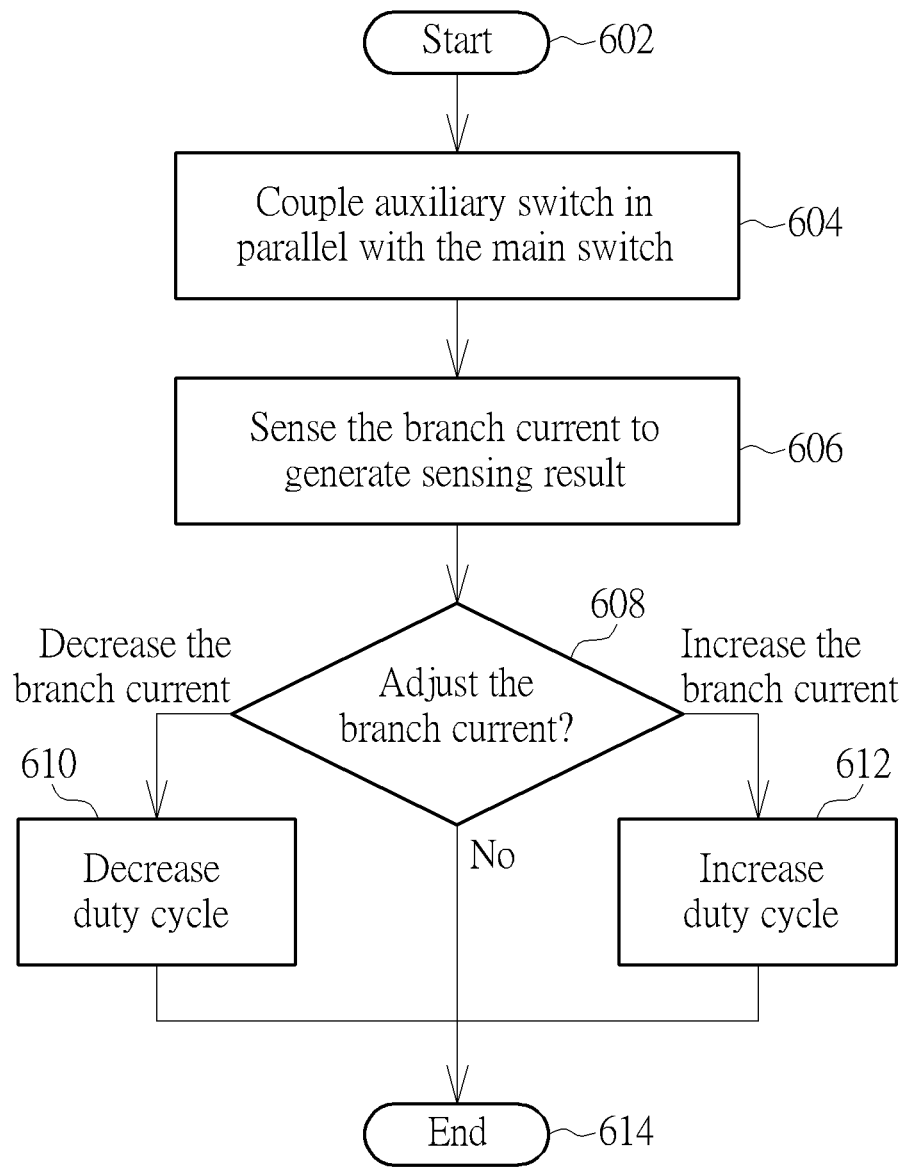
FIG. 6 is a flowchart of an exemplary current steering method for controlling a branch current flowing through a branch which is coupled to a main switch.

Please refer to FIG. 6, which is a flowchart of an exemplary current steering method for controlling a branch current flowing through a branch which is coupled to a main switch. The exemplary current steering method may be employed to the current steering circuit 102 shown in FIG. 1 and/or the current steering circuit 302 shown in FIG. 3. The exemplary current steering method may be summarized as follows.

Step 602: Start.

Step 604: Couple an auxiliary switch in parallel with the main switch.

Step 606: Sense the branch current flowing through the branch to generate a sensing result.

Step 608: Determine whether to adjust the branch current according to the sensing result. If it is determined that the branch current needs to be reduced, go to step 610; if it is determined that the branch current needs to be increased, go to step 612; if it is determined that adjustment of the branch current is not needed, go to step 614.

Step 610: Decrease a duty cycle of a switch control signal of the auxiliary switch in order to reduce the branch current.

Step 612: Increase a duty cycle of a switch control signal of the auxiliary switch in order to increase the branch current.

Step 614: End

As a person skilled in the art should understand the operation of each step shown in FIG. 6 after reading the paragraphs directed to FIG. 1-FIG. 5, further description is omitted here for brevity.

To sum up, the proposed current steering mechanism may have low switching losses and a modular design, and precisely balance branch currents in a circuitry by finely regulating the branch currents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current steering circuit for controlling a branch current flowing through a branch which is coupled to a first main switch, the current steering circuit comprising:
   a sensing device, coupled to the branch, the sensing device arranged for sensing the branch current to generate a sensing result;
   a first auxiliary switch, coupled in parallel with the first main switch; and
   a control unit, coupled to the sensing device and the first auxiliary switch, wherein while the first main switch is turned on, the control unit generates a first switch control signal to the first auxiliary switch, and adjusts a duty cycle of the first switch control signal according to the sensing result in order to adjust the branch current.

2. The current steering circuit of claim 1, wherein when the sensing result indicates that the branch current is larger than a predetermined current value, the control unit decreases the duty cycle of the first switch control signal.

3. The current steering circuit of claim 1, wherein when the sensing result indicates that the branch current is smaller than a predetermined current value, the control unit increases the duty cycle of the first switch control signal.

4. The current steering circuit of claim 1, wherein the first main switch is further coupled in series with a second main switch, and the current steering circuit further comprises:
   a second auxiliary switch, coupled in parallel with the second main switch;
   wherein while the first main switch and the second main switch are turned on, the control unit generates a second switch control signal to the second auxiliary switch, and adjusts at least one of the duty cycle of the first switch control signal and a duty cycle of the second switch control signal according to the sensing result in order to adjust the branch current.

5. The current steering circuit of claim 4, wherein when the sensing result indicates that the branch current is larger than a predetermined current value, the control unit decreases the at least one of the duty cycle of the first switch control signal and the duty cycle of the second switch control signal.

6. The current steering circuit of claim 4, wherein when the sensing result indicates that the branch current is smaller than a predetermined current value, the control unit increases the at least one of the duty cycle of the first switch control signal and the duty cycle of the second switch control signal.

7. The current steering circuit of claim 4, wherein the first switch control signal and the second switch control signal have a same duty cycle set by the control unit.

8. The current steering circuit of claim 4, wherein each of the first main switch and the first auxiliary switch is a charging switch, and each of the second main switch and the second auxiliary switch is a discharging switch.

9. The current steering circuit of claim 1, wherein the branch comprises at least one battery unit.

10. A current steering method for controlling a branch current flowing through a branch which is coupled to a first main switch, the current steering method comprising:
   sensing the branch current to generate a sensing result;
   coupling a first auxiliary switch in parallel with the first main switch; and
   while the first main switch is turned on, generating a first switch control signal to the first auxiliary switch, and adjusting a duty cycle of the first switch control signal according to the sensing result in order to adjust the branch current.

11. The current steering method of claim 10, wherein when the sensing result indicates that the branch current is larger than a predetermined current value, the step of adjusting the duty cycle of the first switch control signal according to the sensing result comprises:
   decreasing the duty cycle of the first switch control signal.

12. The current steering method of claim 10, wherein when the sensing result indicates that the branch current is smaller than a predetermined current value, the step of adjusting the duty cycle of the first switch control signal according to the sensing result comprises:
   increasing the duty cycle of the first switch control signal.

13. The current steering method of claim 10, wherein the first main switch is further coupled in series with a second main switch, and the current steering method further comprises:
   coupling a second auxiliary switch in parallel with the second main switch; and
   while the first main switch and the second main switch are turned on, generating a second switch control signal to the second auxiliary switch, and adjusting at least one of the duty cycle of the first switch control signal and a duty cycle of the second switch control signal according to the sensing result in order to adjust the branch current.

14. The current steering method of claim 13, wherein when the sensing result indicates that the branch current is larger than a predetermined current value, the step of adjusting the at least one of the duty cycle of the first switch control signal and the duty cycle of the second switch control signal according to the sensing result comprises:
   decreasing the at least one of the duty cycle of the first switch control signal and the duty cycle of the second switch control signal.

15. The current steering method of claim 13, wherein when the sensing result indicates that the branch current is smaller than a predetermined current value, the step of adjusting the at least one of the duty cycle of the first switch control signal and the duty cycle of the second switch control signal according to the sensing result comprises:
   increasing the at least one of the duty cycle of the first switch control signal and the duty cycle of the second switch control signal.

16. The current steering method of claim 13, wherein the first switch control signal and the second switch control signal have a same duty cycle.

17. The current steering method of claim 13, wherein each of the first main switch and the first auxiliary switch is a charging switch, and each of the second main switch and the second auxiliary switch is a discharging switch.

* * * * *